United States Patent [19]
Rizvi et al.

[11] Patent Number: 5,801,065
[45] Date of Patent: Sep. 1, 1998

[54] STRUCTURE AND FABRICATION OF SEMICONDUCTOR DEVICE HAVING MERGED RESISTIVE/CAPACITIVE PLATE AND/OR SURFACE LAYER THAT PROVIDES ESD PROTECTION

[75] Inventors: Wajid H. Rizvi, San Jose; Murali K. Denduluri, Santa Clara; Greg Anzelc, Fremont; Henry P. Y. Fong, Daly City; Rahul B. Shinkre, Santa Clara; Daniel Q. Ho, San Jose, all of Calif.

[73] Assignee: Universal Semiconductor, Inc., San Jose, Calif.

[21] Appl. No.: 609,414

[22] Filed: Mar. 1, 1996

Related U.S. Application Data

[63] Continuation of Ser. No. 191,404, Feb. 3, 1994, abandoned.

[51] Int. Cl.$^6$ .................................................. H01L 21/70
[52] U.S. Cl. ........................... 437/60; 437/918; 437/919; 437/904
[58] Field of Search ................... 437/60, 919, 918, 437/904; 257/533, 538, 539; 148/DIG. 14, DIG. 136

[56] References Cited

U.S. PATENT DOCUMENTS

| | | | |
|---|---|---|---|
| 3,402,332 | 9/1968 | Thire | 257/296 |
| 3,408,543 | 10/1968 | Minoru et al. | 257/296 |
| 4,001,869 | 1/1977 | Brown | 437/60 |
| 4,285,001 | 8/1981 | Gerzberg et al. | 257/536 |
| 4,581,815 | 4/1986 | Cheung et al. | 437/200 |
| 4,753,709 | 6/1988 | Welch et al. | 437/200 |
| 4,874,714 | 10/1989 | Eklund | 437/39 |
| 4,910,161 | 3/1990 | Arimoto | 437/60 |
| 5,108,941 | 4/1992 | Paterson et al. | 437/200 |
| 5,182,531 | 1/1993 | Fieldler et al. | 333/167 |
| 5,236,852 | 8/1993 | Cherniawski et al. | 437/200 |
| 5,356,826 | 10/1994 | Natsume | 437/200 |
| 5,514,612 | 5/1996 | Rao et al. | 437/904 |

FOREIGN PATENT DOCUMENTS

| | | |
|---|---|---|
| 63-88855 | 4/1988 | Japan . |
| 3020074 | 12/1990 | Japan ................ 257/296 |

OTHER PUBLICATIONS

VLSI Fabrication Principles, S.K. Ghandhi, 1983 pp. 631–633.

*Primary Examiner*—Michael Trinh
*Attorney, Agent, or Firm*—Skjerven, Morrill, MacPherson, Franklin & Friel; Ronald J. Meetin; David T. Millers

[57] ABSTRACT

A compact RC semiconductor structure suitable for integrated RC and RCD networks contains a semiconductor body (10), an overlying dielectric layer (14), and a resistive plate (16A) situated over the dielectric layer. The resistive plate constitutes both a resistor and at least part of the upper plate of a capacitor whose lower plate (12) is formed with part of the semiconductor body below the dielectric layer. A capacitive structure which provides high ESD protection is formed with a semiconductor body (10) that contains a heavily doped surface layer (12) whose sheet resistance is no more than 5 ohms/square. The surface layer constitutes the lower plate for a capacitor whose upper plate is formed with a conductive plate (16A) situated on a dielectric layer (14) overlying the semiconductor body.

8 Claims, 8 Drawing Sheets

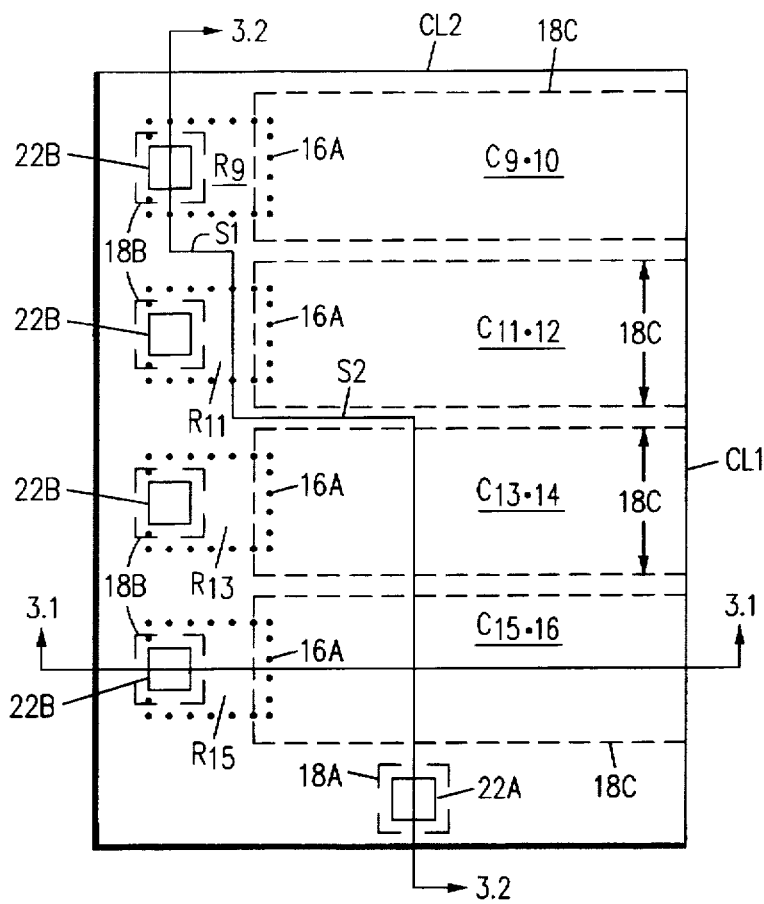
FIG. 2
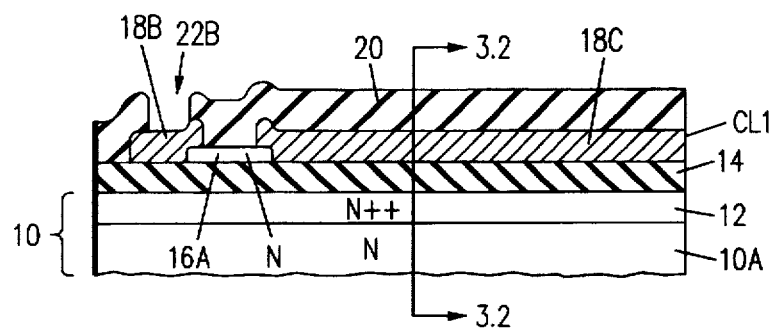
FIG. 3.1
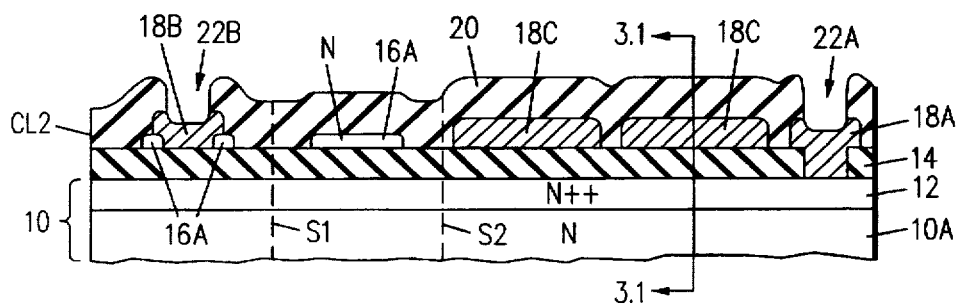
FIG. 3.2

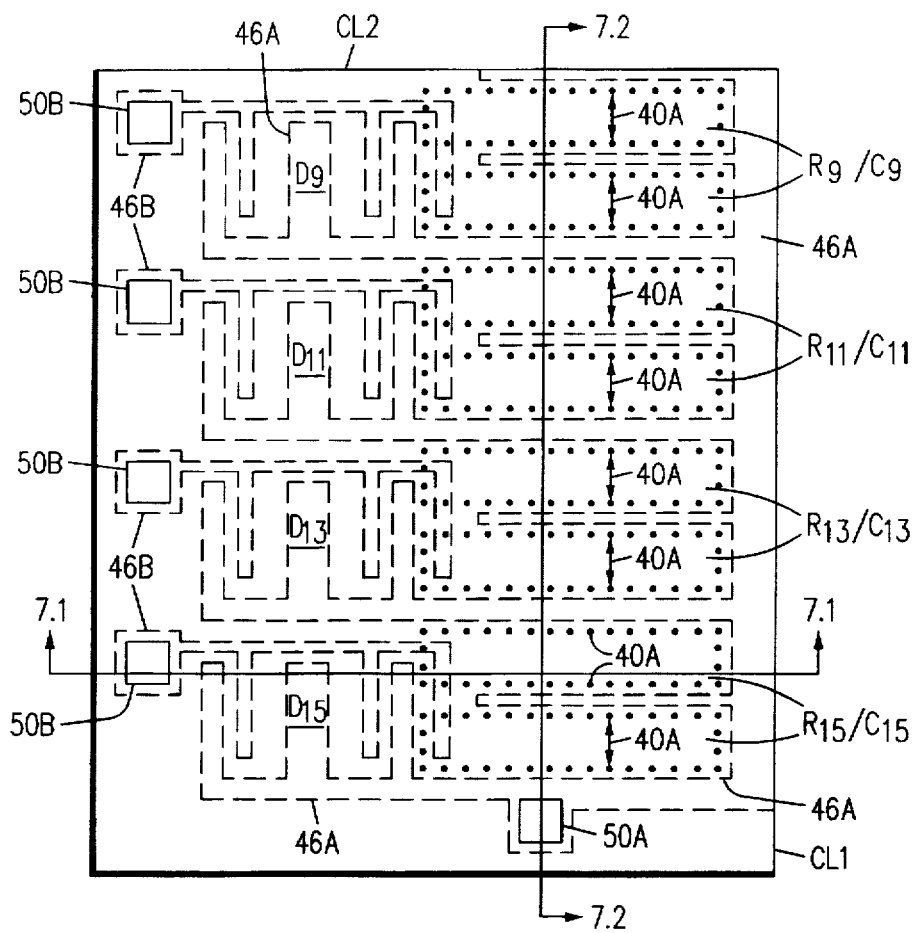
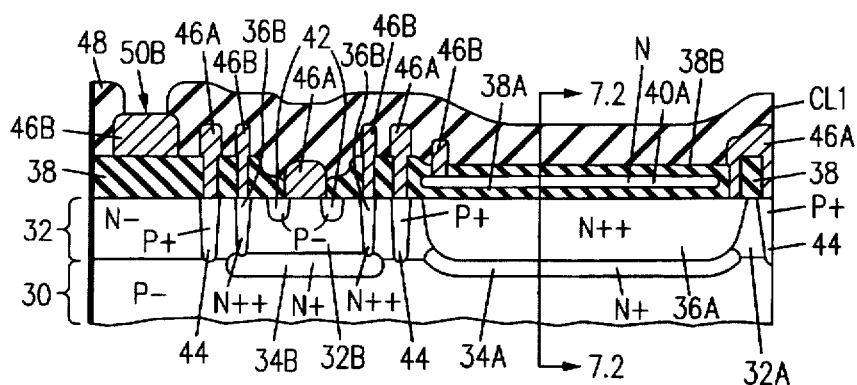
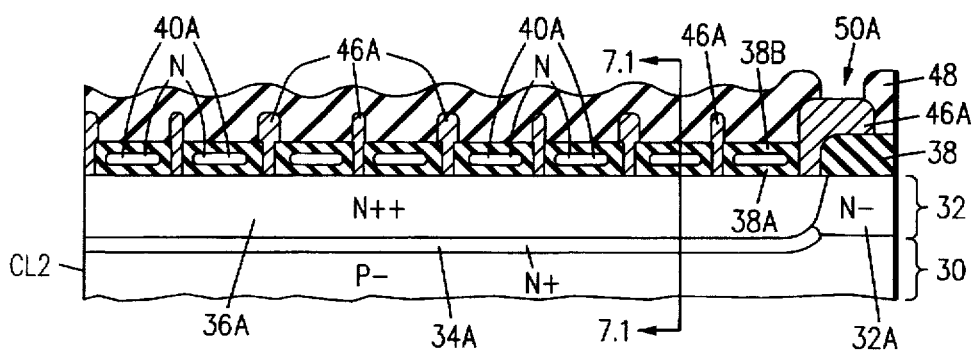
FIG. 6
FIG. 7.1
FIG. 7.2

STRUCTURE AND FABRICATION OF SEMICONDUCTOR DEVICE HAVING MERGED RESISTIVE/CAPACITIVE PLATE AND/OR SURFACE LAYER THAT PROVIDES ESD PROTECTION

This application is a continuation of application Ser. No. 08/191,404, filed Feb. 3, 1994, now abandoned.

FIELD OF THE INVENTION

This invention relates to semiconductor devices that contain capacitors. More particularly, this invention relates to the structure and fabrication of semiconductor resistor-capacitor ("RC") networks used in applications such as filtering. This invention also particularly relates to the structure and fabrication of semiconductor resistor-capacitor-diode ("RCD") networks used in applications such as filtering.

BACKGROUND ART

A conventional type of RC network consists of a group of RC elements connected to a common line that receives a substantially constant voltage, such as ground reference, during device operation. Each RC element is formed with a resistor and a capacitor in series. A group of diodes, typically Schottky diodes, can be incorporated into the network to convert it into an RCD network. The Schottky diodes are variously connected in parallel with the RC elements.

RC and RCD networks are typically utilized in electronic systems that contain printed circuit boards. The RC and RCD networks are mounted on the boards along with other system components such as microprocessor and memory chips.

RC and RCD networks for such board-based systems have been manufactured by assembling discrete resistors, capacitors, and diodes on the boards. Discrete resistors and capacitors are typically made according to thin-film or thick-film techniques, while discrete diodes are made according to conventional semiconductor technology. Unfortunately, the amount of board space occupied by RC and RCD networks fabricated in this conventional way is relatively high. The manufacturing cost can also be relatively high depending on the number of components.

In order to reduce board space and manufacturing cost, the recent trend has been to integrate resistors, capacitors, and diodes into single-chip semiconductor devices using thin-film technology for the resistors while the capacitors and diodes are made according to conventional semiconductor techniques. The thin-film resistors are typically formed with sichrome (a composite of silicon and chromium) or tantalum nitride. Thin-film sichrome and tantalum nitride resistors normally have lower thermal coefficients of resistivity than silicon resistors, particularly polycrystalline silicon ("polysilicon") resistors. However, the fabrication of sichrome and tantalum nitride resistors is more complex than polysilicon resistors. Also, incorporating a resistor into a semiconductor fabrication process is more difficult when the resistor consists of sichrome or tantalum nitride than when the resistor consists of polysilicon.

Single-chip semiconductor devices must typically be able to withstand at least 2000 volts, and preferably more, of electrostatic discharge ("ESD") between any two device pins without undergoing failure. This requirement applies both to active devices—i.e., those which contain transistors—and to passive devices such as RC and RCD networks. A standard human-body model is used in determining the amount of ESD that a semiconductor device can withstand.

Input protection devices ("IPDs"), variously formed with diodes, transistors, and resistors, are used in active semiconductor devices to achieve desired levels of ESD protection. However, IPDs normally alter the characteristics of passive RC and RCD networks. This is disadvantageous. In developing a single-chip RC or RCD network that achieves at least 2000 volts of ESD protection, it is thus desirable to avoid using IPDs that detrimentally affect device characteristics. Capacitors and resistors must be relied on to provide the ESD protection in an RC or RCD network.

The ability of a capacitor (in combination with a suitable resistor) to dissipate ESD depends on the value of the capacitance and the speed with which charge is removed from the affected area—i.e., the device region potentially subject to ESD damage. The capacitance, in turn, varies directly with the area of the capacitor and inversely with the thickness of the capacitor dielectric. It would thus seem that the capacitance could be increased by simply decreasing the dielectric thickness. However, the maximum voltage that can be placed across the capacitor dielectric without causing the capacitor to break down varies directly with the dielectric thickness—i.e., a thinner dielectric breaks down at a lower voltage. For a given charge removal profile, increasing the dielectric breakdown voltage so as to increase the level of ESD protection thereby necessitates an increase in the dielectric thickness and, consequently, an increase in the capacitor area. This is undesirable.

GENERAL DISCLOSURE OF THE INVENTION

The present invention furnishes a highly compact RC semiconductor structure that is particularly suitable for integrated RC and RCD networks. The invention also provides a capacitive semiconductor structure in which a highly conductive surface layer is used to achieve very high levels of ESD protection.

More specifically, in the compact RC structure of the invention, a dielectric layer is situated on a monocrystalline semiconductor body over its upper surface. An electrically conductive resistive plate is, in turn, situated over the dielectric layer. The resistive plate constitutes both a resistor and at least part of a capacitor having a lower plate formed with a portion of the semiconductor body underlying the dielectric layer. Because the resistor and capacitor are merged together in this way, the amount of chip area needed for the present RC structure is considerably less than would be needed for an otherwise equivalent non-merged RC combination.

The resistive plate is preferably formed with doped polycrystalline semiconductor material. In contrast to the prior art where use of sichrome or tantalum nitride to create resistors in RC networks makes it difficult to incorporate resistor fabrication steps into an overall semiconductor manufacturing process, the use of polycrystalline semiconductor material for the resistor in the present invention allows the resistor fabrication steps to be readily incorporated into a semiconductor manufacturing process. Also, the polysilicon semiconductor material is doped with a semiconductor impurity to achieve a thermal coefficient of resistivity of no more than $2 \times 10^{-4}$ ohm/°C. The precise value of the thermal coefficient of resistivity is determined by the doping level of the semiconductor impurity and thus can be readily controlled to achieve an acceptable level.

The RC structure is extended to an RCD structure by providing a metallic portion on the semiconductor body over its upper surface. The metallic portion constitutes a first junction electrode for a Schottky diode whose second junction electrode is formed with a directly underlying portion of the semiconductor body. The resistive plate is normally connected to one of the junction electrodes. The lower plate of the capacitor is then connected to the other junction electrode.

To form an integrated RC network, the resistive plate is replicated a suitable number of times on the dielectric layer overlying semiconductor body. An integrated RCD network is similarly created by appropriately replicating the resistive plate and Schottky diode in the monolithic semiconductor device formed from the semiconductor body.

Turning now to the capacitive structure that provides ESD protection according to the invention, the starting point is a monocrystalline semiconductor body containing a heavily doped surface layer that extends along, and up to, the body's upper surface. The surface layer acts as the lower plate for a capacitor and has a sheet resistance of no more than 5 ohms/square. The structure normally includes an electrical contact for connecting the surface layer to a source of a substantially constant voltage. The contact is preferably located along the body's upper surface.

A dielectric layer is situated on a semiconductor body over the surface layer. A major electrically conductive plate is situated over the dielectric layer, also above the surface layer. The major plate constitutes the upper plate for the capacitor.

When a semiconductor device containing the present capacitive structure is subjected to ESD, the surface layer dissipates the ESD current to provide ESD protection without the need for any separate input protection devices. Because the surface layer is highly conductive, charge is removed very rapidly from the affected area. As a result, a high level of ESD protection is achieved without increasing the dielectric thickness. In fact, the dielectric thickness can be reduced so as to enable the capacitor area to be reduced by as much as 80%. Semiconductor devices that contain the present surface layer along with other passive components but no separate IPDs have successfully withstood 3000–5000 volts of ESD applied through a standard human-body model.

The major plate preferably also constitutes a resistor so as to form a compact RC structure that again provides considerable savings in chip surface area. The RC structure is extended to an RCD structure by providing a metallic portion on the body in order to form a Schottky diode in the manner described above. Replication of the RC or RCD structure as described above then leads to an RC or RCD network. In short, the heavily doped surface layer provides very high levels of ESD protection in integrated RC and RCD networks.

BRIEF DESCRIPTION OF THE DRAWINGS

FIG. 2 is a layout view of an embodiment of the RC network in FIG. 1.

FIGS. 3.1 and 3.2 are cross-sectional structural views of the RC embodiment in FIG. 2. The cross section of FIG. 3.1 is taken through plane 3.1—3.1 in FIGS. 2 and 3.2. The cross section of FIG. 3.2 is taken through stepped plane 3.2—3.2 in FIGS. 2 and 3.1. The structure along steps S1 and S2 in FIG. 2 is not shown in FIG. 3.2.

FIG. 6 is a layout view of an embodiment of the RCD network in FIG. 5.

FIGS. 7.1 and 7.2 are cross-sectional structural views of the RCD embodiment in FIG. 6. The cross section of FIG. 7.1 is taken through plane 7.1—7.1 in FIGS. 6 and 7.2. The cross section of FIG. 7.2 is taken through plane 7.2—7.2 in FIGS. 6 and 7.1.

Figure 1:
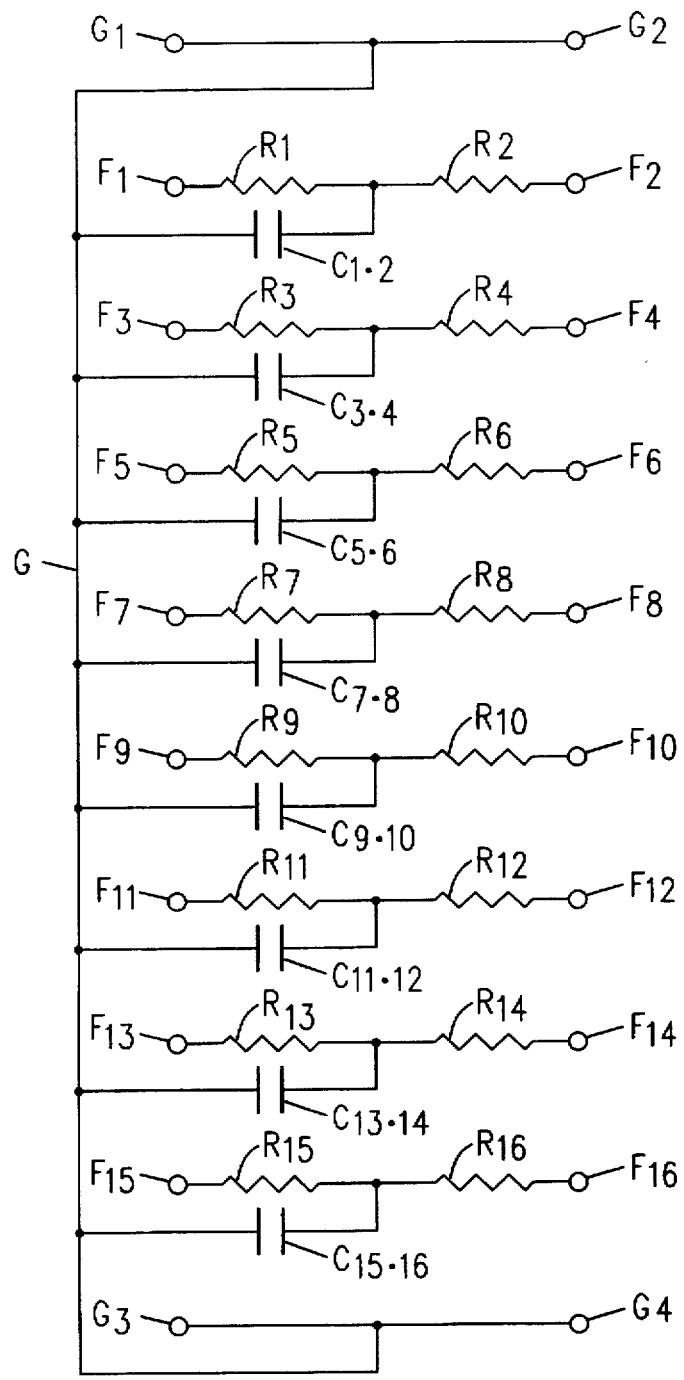
FIG. 1 is a circuit diagram of an RC network having a semiconductor die structure in accordance with the invention.

Like reference symbols are employed in the drawings and in the description of the preferred embodiments to represent the same or very similar item or items. For ion-implantation steps, the "Xs" in the fabrication drawings indicate the location of the maximum implantation concentrations. Photoresist masks are not shown in the drawings.

DESCRIPTION OF THE PREFERRED EMBODIMENTS

Referring to the drawings, FIG. 1 illustrates a circuit for an RC network that is laid out on a semiconductor die and fabricated according to the teachings of the invention. This RC network can be employed as a low-pass filter or as a power-supply filter. The RC network can also be utilized for reducing electromagnetic interference ("EMI") and radio-frequency interference ("RFI").

The RC network in FIG. 1 contains an array of sixteen substantially identical resistors $R_1, R_2, \ldots R_{16}$ and eight substantially identical capacitors $C_{1\text{-}2}, C_{3\text{-}4}, \ldots C_{15\text{-}16}$. One end of each resistor $R_i$, where i is an integer running from 1 to 16, is connected to a corresponding input/output pin $F_i$. During device operation in a typical application of the RC network, part or all of pins $F_1$–$F_{16}$ are connected to one or more additional devices (not shown) at points where filtering or EMI/RFI reduction is to be performed. The other "ends" of each consecutive pair of resistors $R_i$ and $R_{i+1}$ (where i is limited here to odd integers) are connected to the upper plate of corresponding capacitor $C_{i\text{-}i+1}$. As described further below, resistors $R_i$ and $R_{i+1}$ in each such resistor pair are distributed resistors that also form part of the upper plate of capacitor $C_{i\text{-}i+1}$.

The lower plates of capacitors $C_{1\text{-}2}$–$C_{15\text{-}16}$ are connected together through a common ground plate G to four ground pins $G_1, G_2, G_3$, and $G_4$. A substantially constant voltage, typically ground reference, is supplied to all of pins $G_1$–$G_4$. Four such ground pins are utilized instead of one in order to reduce the affect of parasitic inductances that would otherwise harm device performance.

FIG. 2 depicts an embodiment of the inventive die layout for one quarter of the RC network in FIG. 1. The layout of the full RC network is substantially symmetrical about vertical center line CL1 and horizontal center line CL2. FIGS. 3.1 and 3.2 (collectively "FIG. 3") illustrate cross-sectional structural views of the die structure in FIG. 1. As noted above, FIG. 3.2 is a stepped cross section in which the structure along steps S1 and S2 in FIG. 2 is not actually shown in FIG. 3.2. The locations of steps S1 and S2 are indicated by dashed lines in FIG. 3.2.

The RC die structure in FIGS. 2 and 3 is created from a doped N-type region 10 of a monocrystalline silicon ("monosilicon") semiconductor body. Doped N region 10 contains a highly conductive N-type surface layer 12 that extends along, and up to, the upper surface of region 10. N++ surface layer 12 functions as the common lower plate for all of capacitors $C_{1-2}$–$C_{15-16}$. The sheet resistance of N++ surface layer 12 is no more than 5 ohms/square. Also, layer 12 is much more heavily doped than the directly underlying portion 10A of region 10.

A dielectric layer 14 is situated on the semiconductor body above surface layer 12. Sixteen laterally separated electrically conductive resistive plates 16A consisting of doped N-type polysilicon are situated on dielectric layer 14. FIG. 2 illustrates four of these plates. As indicated by FIG. 2 taken with FIG. 3, 2, eight of plates 16A run along one of the long sides of the semiconductor die, while the remaining eight run along the other long side of the die. Plates 16A in FIGS. 2 and 3 respectively constitute resistors $R_1$–$R_{16}$ in FIG. 1. Each plate 16A has a sheet resistance of 10–70 ohms/square.

A patterned metallic layer divided into four substantially identical segments 18A, sixteen substantially identical segments 18B, and eight substantially identical segments 18C is situated on dielectric layer 14. Metallic segments 18A are ground contact pads located along the short ends of the die. Each segment 18A extends through an opening in layer 14 to make ohmic electrical contact with N++ surface layer 12. Metallic segments 18B are input/output contact pads located along the long sides of the die. Each segment 18B makes ohmic electrical contact with a corresponding one of resistive plates 16A.

As to metallic segments 18C, each segment 18C extends between a corresponding pair of resistive plates 16A so as to make ohmic electrical contact with those two plates 16A. Accordingly, each pair of plates 16A interconnected by a corresponding one of metallic segments 18C forms, in combination with that segment 18C, the upper plate of a capacitor for which N++ layer 12 is the lower plate. Since resistive plates 16A in FIGS. 2 and 3 constitute resistors $R_1$–$R_{16}$ in FIG. 1, each consecutive pair of resistors $R_i$ and $R_{i+1}$ in combination with the line connecting that resistor pair in FIG. 1 also constitutes the upper plate of corresponding capacitor $C_{i-i+1}$. In serving as part of capacitor $C_{i-i+1}$, each plate 16A is a distributed resistor.

A passivation layer 20 is situated over resistive plates 16A and metallic segments 18A–18C. Four pad openings 22A extend through passivation layer 20 to respectively expose segments 18A. Sixteen pad openings 22B similarly extend through layer 20 to respectively expose segments 18B. The die structure depicted in FIGS. 2 and 3 is situated on a leadframe (not shown) and is encapsulated in an electrically insulating package (also not shown). Electrical leads (likewise not shown) extend through the encapsulating package to contact metallic segments 18A and 18B so as to form ground pins $G_1$–$G_4$ and input/output pins $F_1$–$F_{16}$.

N++ surface layer 12 rapidly dissipates charge when the present RC network is subjected to ESD. The RC network of the invention has survived 5000 volts of ESD applied through a standard human-body model. In contrast, an integrated RC network which lacked N++ layer 12 but which was otherwise equivalent to the present RC network failed at 1000 volts of ESD. The ability of N++ layer 12 to remove charge very rapidly from affected regions thus increases the ESD protection by several thousand volts.

FIGS. 4a–4f illustrate steps in manufacturing a semiconductor device having a die layout and cross-sectional structure of the type shown in FIGS. 2 and 3. Note that FIGS. 4a–4f depict fabrication of the major elements of the die structure shown in FIGS. 2 and 3. However, FIGS. 4a–4f do not illustrate the structure at any actual cross section through the die structure of FIG. 2.

The starting point for the RC die fabrication is a (100) monosilicon semiconductor body that contains uniformly doped N-type region 10. See FIG. 4a. N region 10 typically constitutes the entire semiconductor body. In this case, region 10 is 525 µm in thickness. However, region 10 could be an epitaxial layer grown on a semiconductor substrate such as N-type silicon. In either case, the resistivity of region 10 is 0.001–0.005 ohm-cm.

Figure 4A:
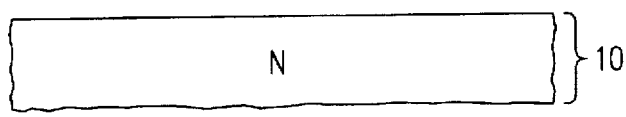
FIGS. 4a, 4b, 4c, 4d, 4e, and 4f are cross-sectional structural views representing steps in manufacturing an RC device such as that shown in FIGS. 2, 3.1, and 3.2.
Figure 4B:
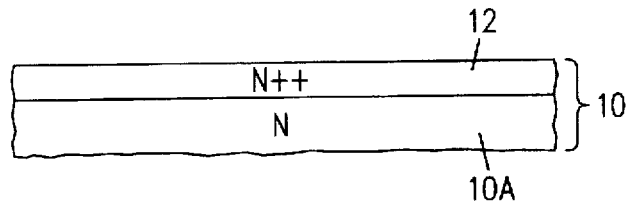

An N-type semiconductor impurity such as phosphorus or arsenic is introduced through the entire upper surface of N region 10 to form heavily doped N-type surface layer 12 as shown in FIG. 4b. Preferably, N++ surface layer 12 is formed by treating the semiconductor body with phosphorus oxychloride ($POCl_3$) and then heating the body to drive phosphorus downward to achieve a thickness of approximately 6 µm for layer 12. The phosphorus oxychloride doping is performed in a furnace tube for 15 minutes at 900°–1100° C., typically 1025° C. During the doping, nitrogen is bubbled through the phosphorus oxychloride and passed over the semiconductor body. The subsequent drive-in step is done at 900°–1100° C., typically 1100° C., for 105 minutes in nitrogen.

Alternatively, N++ layer 12 could be created by ion implanting phosphorus or arsenic followed by a suitable heating step to activate the implanted impurity and drive it further downward. In any case, the net result is that layer 12 is formed in such a manner as to be a highly conductive surface layer whose sheet resistance is no more than 5 ohms/square, typically less than 3 ohms/square. N++ layer 12 is much more heavily doped than directly underlying N remainder 10A of region 10.

Figure 4C:
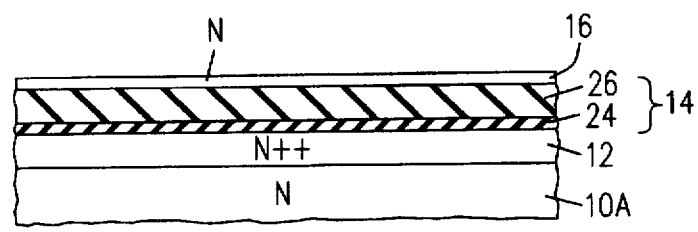
Figure 4D:
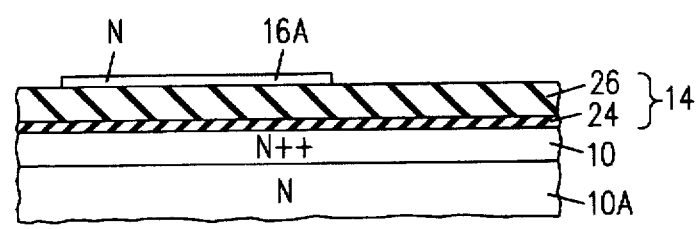

Dielectric layer 14 is formed along the top of N++ layer 12 as shown in FIG. 4c. Layer 14 preferably consists of silicon nitride deposited to a thickness of 4000–5000 Å, typically 4500 Å. Alternatively, layer 14 could consist of a lower sublayer 24 of thermally grown silicon oxide and an upper sublayer 26 of deposited silicon nitride. This alternative is specifically illustrated in the drawings.

A layer of polysilicon is vapor deposited on top of dielectric layer 14 to a thickness of 2600–3000 Å, typically 2800 Å. The polysilicon layer is then doped with an N-type impurity, typically phosphorus, to form N-type polysilicon layer 16 over layer 14. The polysilicon doping is preferably done with phosphorus oxychloride for 20 minutes at 900° C. Ion implantation could also be used. N polysilicon layer 16 achieves a final (i.e., after all process steps are completed) sheet resistance of 20–40 ohms/square, typically 29–31 ohms/square.

In addition to being used to control the sheet resistance of polysilicon layer 16, the N-type impurity introduced into layer 16 is employed to control its thermal coefficient of resistivity. Doping layer 16 in this manner typically enables the average thermal coefficient of resistivity to be no more than $2\times10^{-4}$ ohm/°C. between 0° C. and 70° C.

Using a (suitable) photoresist mask, part of polysilicon layer 16 is selectively removed to create resistive plates 16A. See FIG. 4d. The photoresist is subsequently removed.

Figure 4E:
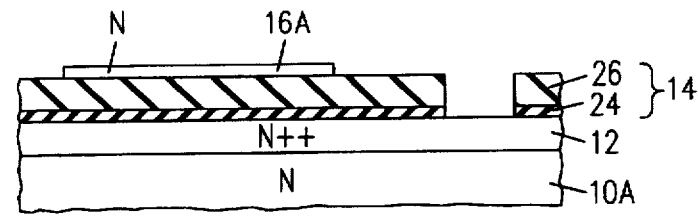
Figure 4F:
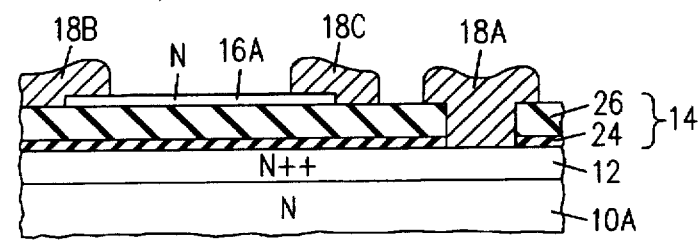

Using another photoresist mask, contact openings are etched through dielectric layer 14 at locations intended for contacts to metallic segments 18A and N++ layer 12. FIG. 4e illustrates the structure after removal of the contact-mask photoresist.

A layer of aluminum with 1% silicon is sputter deposited on top of the structure. The thickness of the aluminum alloy layer is preferably 1 μm. Using a further photoresist mask, portions of the aluminum alloy layer are selectively removed to form metallic segments 18A–18C. The metal-mask photoresist is subsequently removed.

The RC semiconductor device is now completed in a conventional manner. In particular, passivation layer 20 (shown only in FIG. 3) is deposited on top of the structure and selectively etched using a fourth photoresist mask to create pad openings 22A and 22B. Passivation 20 preferably consists of 7000 Å of silicon dioxide of which the upper 6000 Å are doped with phosphorus. The die is subsequently mounted on the base of the leadframe. The encapsulating package is formed around the die structure and leadframe to complete device fabrication.

In the final RC network, each resistor $R_i$ typically has a resistance of 24 ohms. Each capacitor $C_{i,i+1}$ typically has a capacitance of 200 picofarads. However, these values could be varied by changing the doping levels, dielectric thickness, and layout to achieve other desired specifications.

Figure 5:
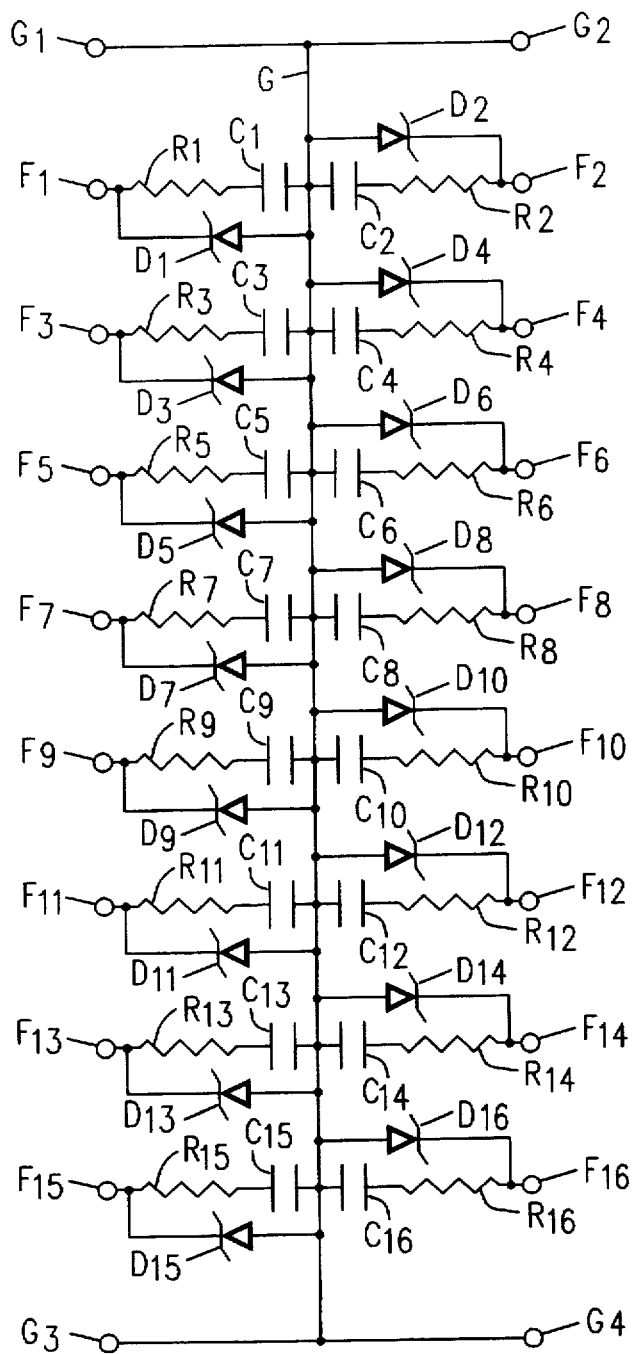
FIG. 5 is a circuit diagram of an RCD network having semiconductor die structure in accordance with the invention.

FIG. 5 illustrates a circuit for an RCD network that is laid out on a semiconductor die and manufactured according to the invention. As with the RC network in FIG. 1, the RCD network in FIG. 5 can be used as a filter and for EMI/RFI reduction. The RCD network can also be employed to clamp negative voltage spikes and to reduce noise on high-speed data lines. The diodes perform the voltage-spike clamping.

The RCD network in FIG. 5 contains an array of sixteen substantially identical resistors $R_1, R_2, \ldots R_{16}$, sixteen corresponding substantially identical capacitors $C_1, C_2 \ldots C_{16}$, and sixteen corresponding substantially identical Schottky diodes $D_1, D_2, \ldots D_{16}$. Each Schottky diode $D_i$ consists of a pair of junction electrodes referred to here as the cathode and anode. One end of each resistor $R_i$ is connected in common with the cathode of diode $D_i$ to a corresponding input/output pin $F_i$. During operation in a typical application of the RCD network, part or all of pins $F_1$–$F_{16}$ are connected to one or more additional devices (not shown) at points where filtering, EMI/RFI reduction, negative-voltage clamping, and/or data-line noise reduction is to be performed. The other "end" of each resistor $R_i$ is connected to the upper plate of corresponding capacitor $C_i$. As discussed further below, each resistor $R_i$ is a distributed resistor that also largely forms the upper plate of capacitor $C_i$.

The lower plates of capacitors $C_1$–$C_{16}$ are connected together through common ground plate G. The anodes of diodes $D_1$–$D_{16}$ are also connected to plate G. A substantially constant voltage, typically ground reference, is supplied to plate G by way of ground pins $G_1$–$G_4$ as in the RC network of FIG. 1.

FIG. 6 shows an embodiment of the inventive die layout for one quarter of the RCD network in FIG. 5. The layout of the full RCD network is substantially symmetrical about vertical center line CL1. The layout of the RC network is also substantially symmetrical about horizontal center line CL2 except that no ground contact pads are used in the upper half of the network. The die portions that form diodes $D_1$–$D_{16}$ are situated to the left in FIG. 6, while the die portions that form resistors $R_1$–$R_{16}$ and capacitors $C_1$–$C_{16}$ are situated to the right. FIGS. 7.1 and 7.2 (collectively "FIG. 7") illustrate cross-sectional views of the die structure in FIG. 6.

The RCD die structure is created from a monocrystalline silicon semiconductor body consisting of a lightly doped P-type substrate 30 and an overlying lightly doped N-type epitaxial layer 32. The semiconductor body contains a pair of laterally separated heavily doped N-type buried layers 34A that extend along the interface between P– substrate 30 and N– epitaxial layer 32. The semiconductor body also contains a pair of laterally separated very heavily doped N-type layers 36A that extend along the top of epitaxial layer 32. Item 32A in FIG. 7 indicates the lightly doped N– portion of epitaxial layer 32 laterally surrounding N++ layers 36A. Each N++ layer 36A extends from the upper epitaxial surface down to a corresponding one of buried N+ layers 34A to form a composite highly conductive N-type surface layer referred to here by the reference notation 34A/36A.

FIG. 7 illustrates one of composite N-type surface layers 34A/36A. Although not shown in FIG. 6, each of composite layers 34A/36A is shaped like a long rectangle in layout view. Each of layers 34A/36A is located near vertical center line CL1 and extends along most of the length of the die.

Each of highly conductive layers 34A/36A functions as a common lower plate for eight of capacitors $C_1$–$C_{16}$. In particular, one of layers 34A/36A is the lower plate for capacitors $C_i$ with odd-numbered subscripts, while the other layer 34A/36A is the lower plate for capacitors $C_i$ with even-numbered subscripts. Each of composite layers 34A/36A has a sheet resistance of no more than 5 ohms/square just as in the RC network. Furthermore, layers 34A/36A are much more heavily doped than the directly underlying P-type material of substrate 30.

A dielectric layer 38A is situated on epitaxial layer 32 above N++ layers 36A. Thirty-two laterally separated electrically conductive resistive plates 40A consisting of doped N-type polysilicon are situated on dielectric layer 38A. Another dielectric layer 38B is situated on resistive plates 40A. Dielectric layers 38A and 38B extend around resistive plates 40A to form a composite dielectric layer 38.

Returning to resistive plates 40A, sixteen of them overlie one of composite layers 34A/36A, while the remaining sixteen overlie the other layer 34A/36A. FIG. 6 depicts eight of plates 40A. Each consecutive pair of plates 40A are connected in parallel (as described further below) to form one of resistors $R_1$–$R_{16}$. Each plate 40A has a sheet resistance of 10–70 ohms/square. Furthermore, each consecutive pair of plates 40A is a distributed resistor that constitutes the upper plate of corresponding capacitor $C_i$.

The cathodes of Schottky diodes $D_1$–$D_{16}$ are formed with laterally separated portions of the semiconductor body. Specifically, each $D_i$ cathode consists of a lightly doped N-type portion 32B of epitaxial layer 30, a heavily doped N-type buried layer 34B, and a pair of laterally separated very heavily doped N-type contact zones 36B. N– region 32B forms a metal-semiconductor rectifying junction with the $D_i$ anode (discussed further below). N+ buried layer 34B extends along the interface between substrate 30 and epitaxial layer 32 below the metal-semiconductor rectifying junction. N++ contact zones 36B extend from the upper epitaxial surface down to buried layer 34B. During normal device operation, electrons flow downward through N++ contact zones 36B, laterally inward through N+ buried layer 34B, upward through the central portion of N– region 32B, and then through the rectifying junction.

Each Schottky diode $D_i$ also has a lightly doped P-type guard region 42 for reducing current leakage. P– guard region 42 is situated around the Schottky rectifying junction along the upper surface of N– region 32B. As indicated below, guard ring 42 is also electrically shorted to N– region 32B via the $D_i$ anode. N– region 32B and P– guard ring 42 form a P–/N– diode around the periphery of the rectifying junction. This P–/N– diode reduces the surface leakage current along the Schottky rectifying junction to a value usually at least an order of magnitude below that which would otherwise occur.

A patterned heavily doped P-type isolation region 44 extends vertically through epitaxial layer 32 and partly into substrate 30. Part of P+ isolation region 44 extends along vertical center line CL1 in order to separate N− regions 34A from each other. Further parts of P+ region 44 laterally surround each of the monocrystalline silicon portions that form the $D_i$ cathodes. Consequently, P+ region 44 in combination with P− substrate 30 electrically isolates the $D_i$ cathodes from one another and from the other monosilicon circuit elements.

Dielectric layer 38 also lies over N− region 32B and P+ region 44. A patterned metallic layer consisting of a segment 46A and sixteen largely identical segments 46B is situated on dielectric layer 38. Metallic segment 46A extends through openings in layer 38 to contact each guard ring 42 and adjoining region 32B at the $D_i$ rectifying junction. These parts of metallic segment 46A constitute the $D_i$ anodes. Segment 46A also extends through openings in layer 38 to contact N++ layer 36A and P+ region 44. Each metallic segment 46B extends through openings in layer 38 to contact a corresponding one of polysilicon resistive plates 40A and associated N++ contact zones 36B. In this way, the circuit connections of FIG. 5 are attained.

A passivation layer 48 of electrically insulating material is situated over dielectric layer 38 and metallic segments 46A and 46B. Two pad openings 50A, one on each side of vertical center line CL1, extend through passivation layer 48A to expose parts of metallic segment 46A. Note that no pad openings extend through layer 48 to expose parts of segment 46A along the unshown portions of the die above horizontal center line CL2 in FIG. 6. Sixteen pad openings 50B extend through layer 48 to respectively expose sixteen portions of metallic segment 46B.

The die structure in FIGS. 6 and 7 is situated on the base of a leadframe (not shown) having twenty electrical leads. The leadframe base is connected to four of the leads, with two of these four leads being respectively connected to pads 50A. The remaining sixteen leads are respectively connected to pads 50B. The RCD die structure and leadframe are encapsulated in an electrically insulating package (also not shown) with leads extending through the package to form ground pins $G_1$–$G_4$ and input/output pins $F_1$–$F_{16}$.

N++ surface layers 36A in combination with N+ buried layers 34A dissipate charge rapidly when the present RCD network is subjected to ESD. The RCD network of the invention has survived 5000 volts of ESD applied through a standard human-body model. On the other hand, an integrated RCD network which lacked N++ layers 36A (and 36B) but which was otherwise largely equivalent to the present RCD network survived 2000 volts of ESD but failed at 3000 volts. The ability of composite layers 34A/36A to remove charge very rapidly from affected regions thereby provides an additional several thousand volts of ESD protection.

FIGS. 8a–8k illustrate steps in fabricating a semiconductor device that has a die layout and cross-sectional structure of the type depicted in FIGS. 6 and 7. As with the die manufacturing description of FIGS. 4a–4f, FIGS. 8a–8k illustrate the fabrication of the major elements of the RCD die shown in FIGS. 6 and 7 but do not depict the structure at any actual cross section through the die structure in FIG. 6.

The starting point for manufacturing the RCD structure is P− substrate 30 which consists of boron-doped (111) monosilicon having a resistivity of 7–21 ohm-cm. See FIG. 8a. A layer (not shown) of silicon oxide is grown on top of substrate 30 to a thickness of 7000 Å. The oxide layer is preferably formed at 900°–1050° C. in wet oxygen. Using a (suitable) photoresist mask, openings are etched through the oxide layer at the general locations for N+ buried layers 34A and 34B.

After removing the photoresist, antimony in the form of $Sb^+$ is ion implanted through the oxide openings into substrate 30 at (a dose of) $4 \times 10^{15}$ ions/cm$^2$ and (an energy of) 80 kiloelectron volts ("KEV"). An anneal is performed to activate the implanted antimony and drive it to a depth of 4–6 μm. The anneal is done at 900°–1250° C. in oxygen and nitrogen ambients.

Figure 8A:
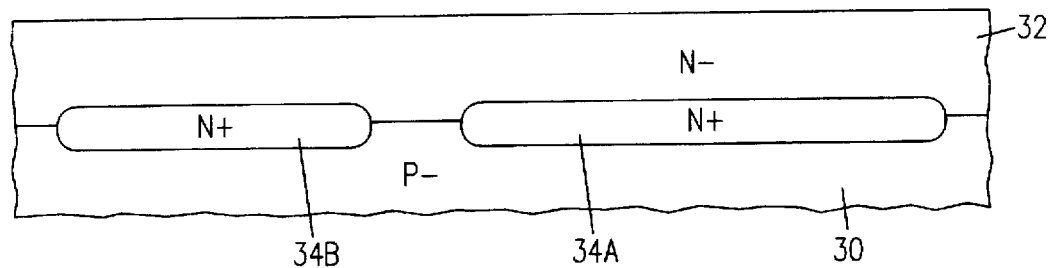
FIGS. 8a, 8b, 8c, 8d, 8e, 8f, 8g, 8h, 8i, 8j, and 8k are cross-sectional structural views representing steps in manufacturing an RCD device such as that shown in FIGS. 6, 7.1, and 7.2.

All of the remaining oxide on top of substrate 30 is etched away after which N− epitaxial layer 32 is grown to a thickness of 2.5–3.0 μm. During the epitaxial growth, layer 32 is doped with phosphorus to achieve a resistivity of 0.7–0.9 ohm-cm. Also, the implanted antimony diffuses upward somewhat into epitaxial layer 32 to establish the positions for N+ buried layers 34A and 34B. FIG. 8a illustrates the structure at the end of the epitaxial growth.

An electrically insulating layer 52 of silicon oxide is thermally grown on top of epitaxial layer 32 to a thickness of approximately 7000 Å. See FIG. 8b. Oxide layer 52 is preferably formed at 900°–1050° C. in wet oxygen. A patterned opening is etched through layer 52 at the general location for P+ isolation region 44 using a photoresist mask.

Figure 8B:
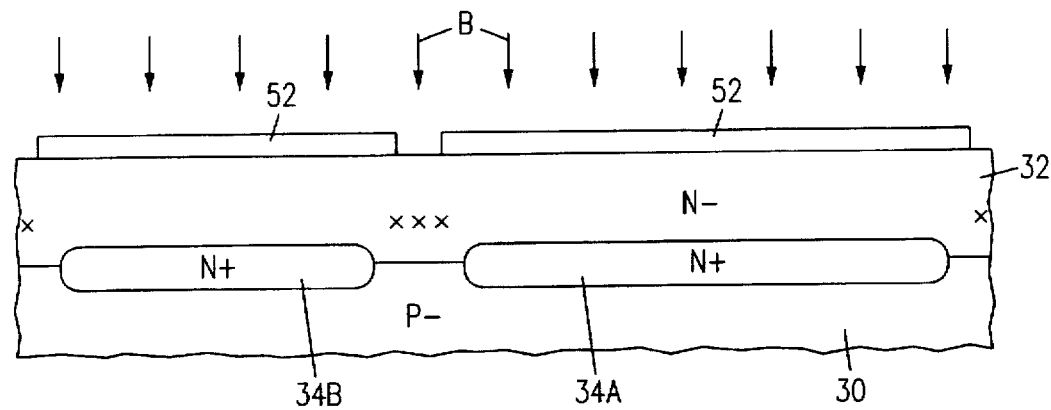

After removing the photoresist, boron in the form of $B^+$ is ion implanted through the oxide opening into epitaxial region 32 as shown in FIG. 8b. The boron implant is done at $5 \times 10^{15}$ ions/cm$^2$ and 30–50 KEV. An anneal is performed to activate the implanted boron and drive it further into the silicon to form P+ isolation region 44 which penetrates slightly into P− substrate 30. See FIG. 8c. The anneal is done at 900°–1100° C. in an ambient which, during at least part of the anneal, includes oxygen. As a result, the thickness of oxide layer 52 increases somewhat, with 2500–3000 Å of silicon oxide being formed along the exposed silicon areas.

Figure 8C:
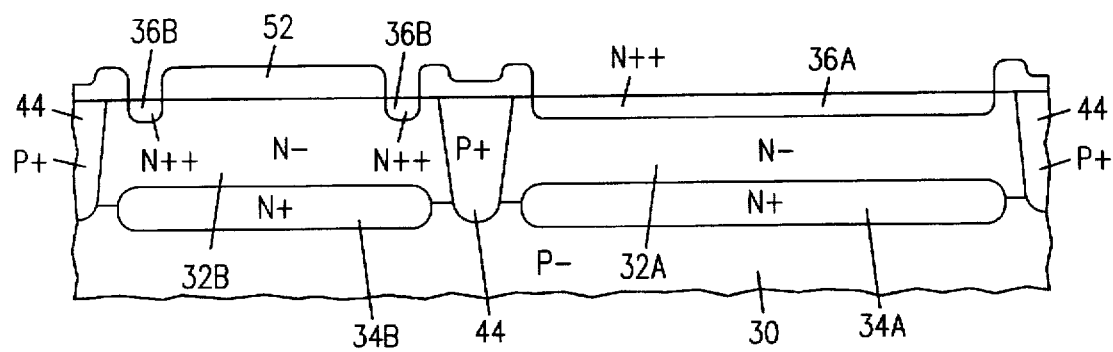

Using a suitable photoresist mask, openings are etched through oxide layer 52 at the general locations for N++ layers 36A and 36B. The photoresist is removed after which an N-type impurity such as phosphorus or arsenic is ion implanted into epitaxial layer 32 through the oxide openings to form N++ layers 36A and 36B at a relatively shallow depth. Preferably, the N-type impurity consists of phosphorus which is introduced into epitaxial layer 32 by treating the structure with phosphorus oxychloride for 15 minutes at 900°–1100° C., typically 1025° C. FIG. 8c illustrates the structure at this point.

Figure 8D:
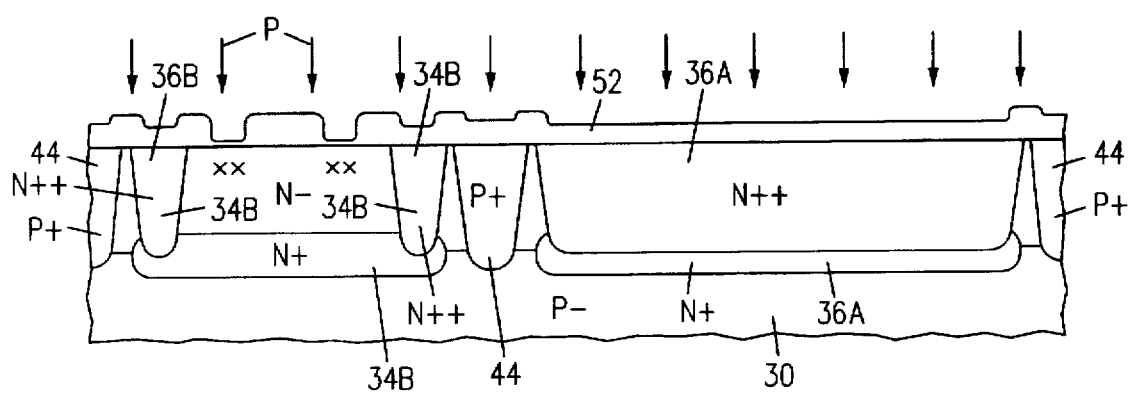

An anneal is performed to drive N++ regions 36A and 36B through, or substantially through, epitaxial layer 32 such that they respectively meet N+ buried layers 34A and 34B as shown in FIG. 8d. The anneal is done at 900°–1100° C. in an ambient which, during at least part of the anneal, includes oxygen. Consequently, the thickness of oxide layer 52 again increases somewhat. In particular, approximately 6300 Å of silicon oxide are formed along the exposed silicon areas.

The structure shown in FIG. 8d for N++ layers 36A and 36B could alternatively be achieved by ion implanting phosphorus or arsenic and then annealing. Regardless of what technique is used, the sheet resistance of composite highly conductive layers 34A/36A reaches the previously mentioned value of no more than 5 ohms/square, typically less than 3 ohms/square. Composite layer 34A/36A has a much heavier doping than the underlying P-type material of substrate 30.

Openings are etched through oxide layer 52 at the general locations for P− guard rings 42. After removing the photoresist, a short anneal is performed at 900° C. in an ambient which, during part of the anneal, includes oxygen to grow approximately 500 Å of silicon oxide along the exposed silicon surface at the new oxide openings. Boron in the form of B$^+$ is then ion implanted through the thin oxide at the oxide openings and into epitaxial layer 32 as depicted in FIG. 8d. The boron implantation is done at $9.5 \times 10^{14}$ ions/cm$^2$ and 35 KEV.

Figure 8E:
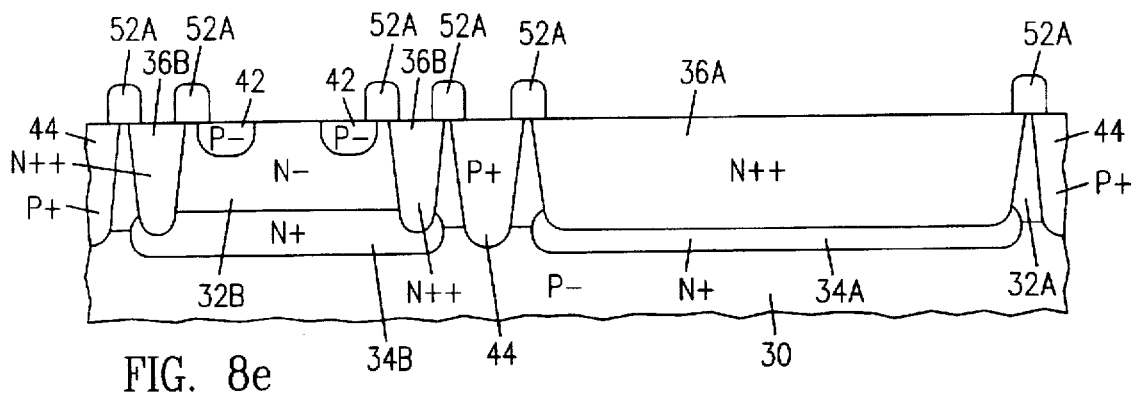

A further anneal is performed to activate the newly implanted boron and drive it slightly into epitaxial layer 32 to form P− guard rings 42. See FIG. 8e. The anneal is done at 900°–1050° C. in an ambient which, during part of the anneal, includes oxygen. The thickness of oxide layer 52 again increases, with approximately 4000 Å of silicon oxide being formed along the thin oxide at the new oxide openings. Item 32A in FIG. 8e is the remaining lightly doped N-type epitaxial material between N++ layer 36A and P+ isolation region 42. Item 32B is the remaining lightly doped N-type epitaxial material situated generally between N++ contact zones 36B.

Using a photoresist mask, portions of oxide layer 52 overlying (a) nearly all of N++ layers 36A, (b) the sections of N− regions 32B surrounded by P− guard rings 42, and (c) adjoining parts of guard rings 42 are removed as indicated in FIG. 8e. Openings are also simultaneously etched through oxide layer 52 to expose parts of the upper surfaces of N++ contact zones 36B and P+ isolation region 44. Item 52A in FIG. 8e indicates the remainder of oxide layer 52.

A layer 54 of silicon nitride is deposited on the top of the structure. See FIG. 8f. Nitride layer 54 later becomes the dielectric for capacitors $C_1$–$C_{16}$. The thickness of layer 54 depends on the desired capacitance. In the present example, the silicon nitride thickness is approximately 1700 Å. Alternatively, the capacitor dielectric could be formed with other insulators such as silicon oxide.

Figure 8F:
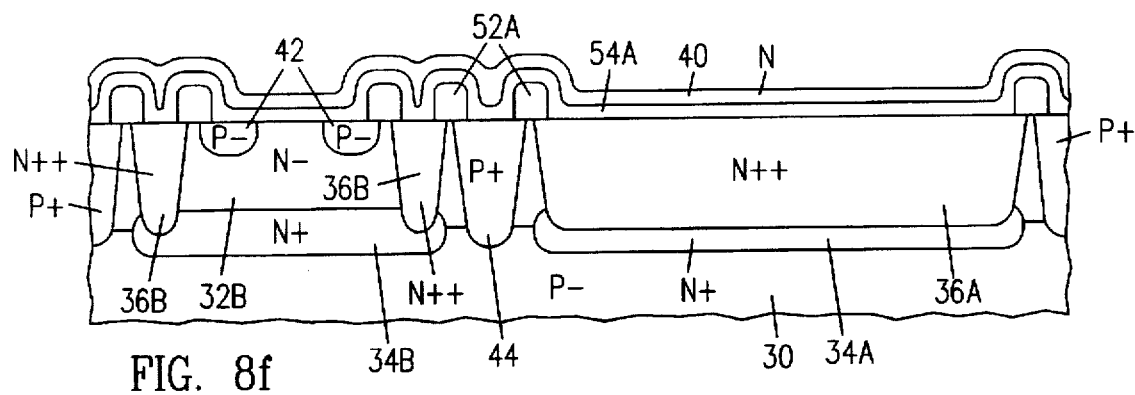
Figure 8G:
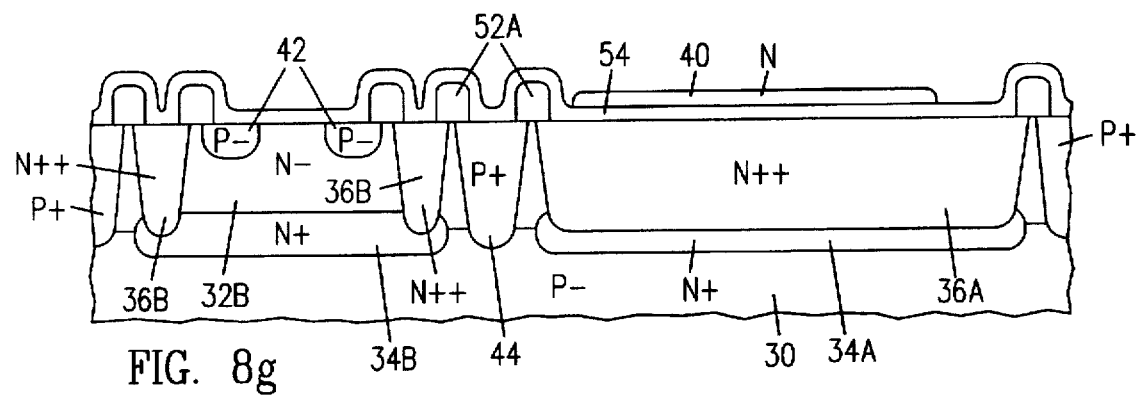
Figure 8H:
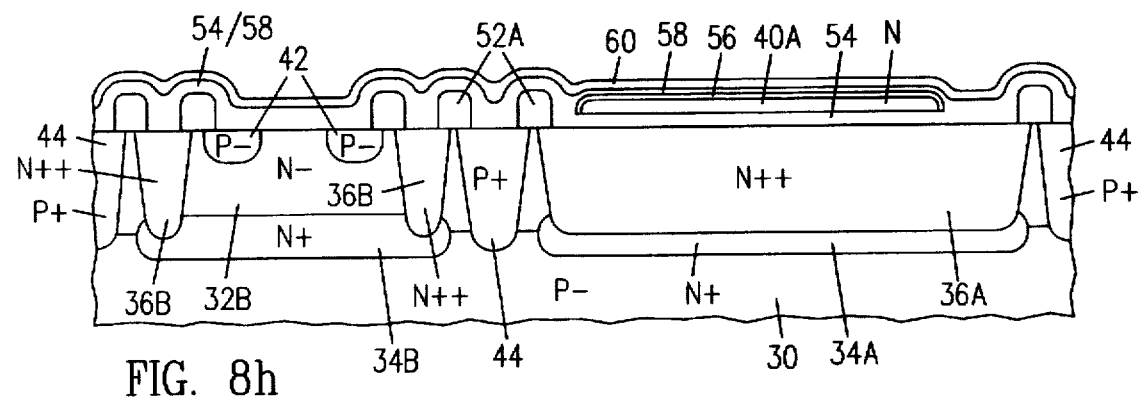

A layer 40 of polysilicon is deposited on nitride layer 54 as indicated in FIG. 8f. The polysilicon thickness is 1500–1600 Å. Inasmuch as polysilicon layer later becomes resistive plates 40A that serve both as resistors $R_1$–$R_{16}$ and the upper plates of capacitors $C_1$–$C_{16}$, layer 40 is doped with an N-type impurity at a level sufficient to make layer 40 conductive but still resistive. The doping level determines the sheet resistance of resistors $R_1$–$R_{16}$. Also, the doping level is controlled to achieve a desired thermal coefficient of resistivity for resistors $R_1$–$R_{16}$.

Preferably, the N-type impurity consists of phosphorus which is introduced into polysilicon layer 40 by subjecting it to phosphorus oxychloride for 20 minutes at 900° C. N layer 40 thereby reaches a final sheet resistance of 40–60 ohms/square, typically 50–55 ohms/square. The resulting average thermal coefficient of resistivity for layer 40 is no more than $2 \times 10^{-4}$ ohm/°C. across the temperature range of 0°–70° C.

Using a photoresist mask, part of polysilicon layer 40 is selectively removed to create resistive plates 40A. See FIG. 8g. The photoresist is subsequently removed.

A thin electrically insulating layer 56 of silicon oxide is thermally grown along the top of each resistive plate 40A to a thickness of 300–400 Å by exposing the structure to dry oxygen for 20 minutes at 900° C. See FIG. 8h. A thin electrically insulating layer 58 of silicon nitride is deposited on top of the structure to a thickness of approximately 200 Å. When nitride layer 58 lies directly on nitride layer 54, the two layers are indicated as composite nitride layer 54/58 in FIG. 8h. An electrically insulating layer 60 of silicon oxide is deposited at relatively low temperature on top of nitride layer 58. Oxide layer 60 is approximately 2000 Å in thickness.

Figure 8I:
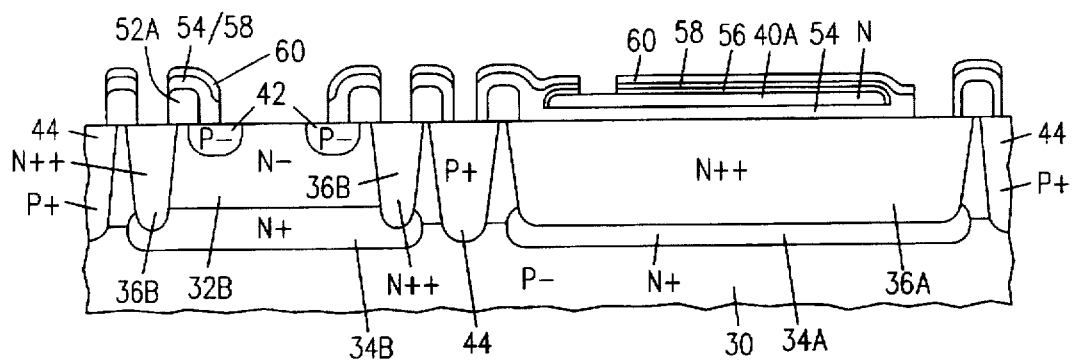
Figure 8J:
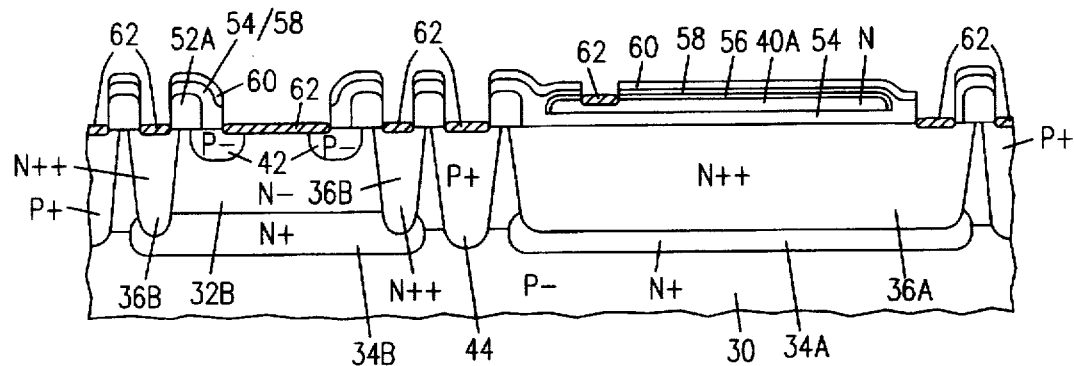

Using a photoresist mask, openings are etched through oxide layer 60 at the locations intended for the contacts to layers/regions 36A, 40A, 32B/42, 36B, and 44. The photoresist is removed after which the openings are extended through nitride layers 58 and 54/58 and, where present, through oxide layer 56 to create contact openings to both the monosilicon and polysilicon. FIG. 8i illustrates the resulting structure.

A layer of platinum is sputter deposited on top of the structure and into the contact openings down to the exposed silicon. The platinum thickness is approximately 250 Å. The platinum is sintered at approximately 450° C. to convert the platinum lying on the silicon into platinum silicide segments 62. The unreacted platinum (lying on the insulating material) is removed with aqua regia to produce the structure shown in FIG. 8j.

Figure 8K:
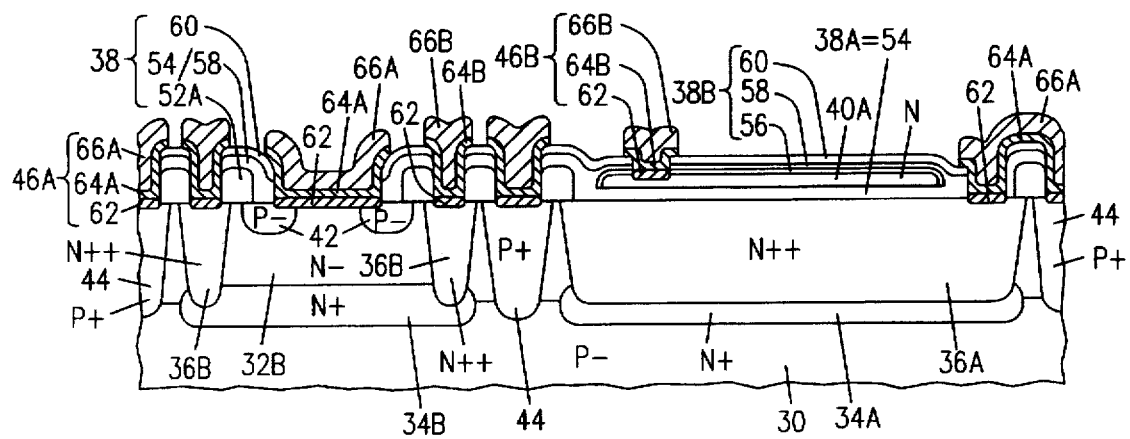

A layer of titanium-tungsten (10–15% titanium/80–85% tungsten) is sputter deposited on top of the structure to a thickness of approximately 1500 Å. An aluminum-alloy layer consisting of aluminum with 1% silicon is sputter deposited on the titanium-tungsten layer to a thickness of approximately 1 μm. Using a photoresist mask, the aluminum-alloy and titanium-tungsten layers are patterned to create a titanium-tungsten segment 64A, an overlying aluminum-alloy segment 66A, sixteen titanium-tungsten segments 64B, and sixteen respectively overlying aluminum-alloy segments 66B. FIG. 8k depicts the consequent structure.

Al-alloy segment 66A, Ti-W segment 64A, and underlying PtSi segment 62 in FIG. 8k constitute metallic segment 46A in FIGS. 6 and 7. Likewise, Al-alloy segment 66B, Ti-W segment 64B, and underlying PtSi segment 62 in FIG. 8k form metallic segments 46B in FIGS. 6 and 7. The following correspondence also exists between the insulating layers in FIG. 8k and those in FIGS. 6 and 7: nitride layer 54 constitutes dielectric layer 38A; oxide layer 56, nitride layer 58, and oxide layer 60 together constitute insulating layer 38B; and oxide layer 52A, nitride layer 54/58, and oxide layer 60 together constitute insulating layer 38.

To complete the RCD network, passivation layer 48 (shown only in FIG. 7) is deposited on top of the structure. Layer 48 preferably consists of 8000 Å of silicon oxide of which the upper 6500 Å are phosphorus doped. Layer 48 is selectively etched using a photoresist mask to form pad openings 50A and 50B. The die structure is subsequently mounted on the base of the leadframe using electrically insulating epoxy. The leads are connected in the way described above. Finally, the encapsulating package is formed around the die structure and leadframe.

In the final RCD network, each resistor $R_i$ typically has a resistance of 47 ohms. Each capacitor $C_i$ typically has a capacitance of 33 picofarads. Each diode $D_i$ has a forward (turn-on) voltage of approximately 0.5 volt.

In manufacturing the present RC and RCD networks, all photoresist masks are formed according to conventional techniques. All silicon-oxide etches are performed with dilute hydrofluoric acid solutions. Phosphoric acid is used for all silicon-nitride etches. All polysilicon etches are done with mixtures of hydrofluoric acid, nitric acid, and de-ionized water.

While the invention has been described with reference to particular embodiments, this description is solely for the purpose of illustration and is not to be construed as limiting the scope of the invention claimed below. For example, each Schottky diode could consist of a pair of Schottky diodes in parallel. The conductivity types of certain of the silicon regions could be reversed from those described above. The anodes for the Schottky diodes could be fabricated with materials such as pure aluminum, aluminum with a small percent of silicon, and titanium. Various modifications and applications may thus be made by those skilled in the art without departing from the true scope and spirit of the invention as defined in the appended claims.

We claim:

1. A method comprising the steps of:

introducing a semiconductor impurity into part of a monocrystalline semiconductor body to form a doped surface layer extending along, and up to, an upper surface of the body, the doped surface layer acting as a lower plate for a capacitor;

forming a dielectric layer along the upper surface of the monocrystalline semiconductor body the dielectric layer overlying at least a portion of the doped surface layer;

forming an upper plate of the capacitor, the upper plate overlying portions of the dielectric layer and the doped surface layer; and forming a metallic pad for connecting the lower plate of the capacitor to a source of a substantially constant voltage, the metallic pad contacting the surface layer at the upper surface of the body, wherein forming the metallic pad further comprises forming a patterned metallic layer on the semiconductor body over its upper surface, the metallic layer constituting the metallic pad and a first junction electrode for a Schottky diode.

2. A method as in claim 1, wherein the step of forming the upper plate comprises:

forming a patterned semiconductive layer over the surface layer and the dielectric layer, the patterned semiconductive layer including a first region disposed on a first portion of the dielectric layer, the first region constituting a first portion of an upper plate of the capacitor.

3. A method as in claim 2, wherein the region of the semiconductive layer comprises a polycrystalline semiconductor material doped with a semiconductor impurity to achieve an average thermal coefficient of resistivity of no more than $2 \times 10^{-4}$ ohm/°C. across the temperature range of 0° C. to 70° C.

4. A method as in claim 2, further including the step of forming a contact to the upper plate, wherein the contact to the upper plate contacts the region of the semiconductive layer.

5. A method comprising the steps of:

introducing a semiconductor impurity into part of a monocrystalline semiconductor body to form a doped surface layer extending along, and up to, the body's upper surface, the surface layer acting as a lower plate for a capacitor;

forming a dielectric layer overlying the surface layer;

forming a patterned semiconductive layer over the surface layer and the dielectric layer, the patterned semiconductive layer including a first region disposed on a first portion of the dielectric layer, the first region constituting a first portion of an upper plate of the capacitor; and forming a patterned metallic layer over the surface layer and the dielectric layer, the metallic layer comprising a second region disposed on a second portion of the dielectric layer, wherein the second region is in electrical contact with the first region and constitutes a second portion of the upper plate of the capacitor.

6. A method as in claim 5, wherein the step of forming the patterned semiconductor layer comprises forming a layer of polycrystalline semiconductor material doped with a semiconductor impurity to achieve an average thermal coefficient of resistivity of no more than $2 \times 10^{-4}$ ohm/°C. across the temperature range of 0° C. to 70° C.

7. A method as in claim 5, further including the step of forming a contact to the upper plate, wherein the contact to the upper plate contacts the first region of the semiconductive layer.

8. A method as in claim 5, wherein the step of forming the patterned semiconductive layer comprises forming a third region disposed on a third portion of the dielectric layer and separate from the first region, wherein the third region constitutes a third portion of the upper plate of the capacitor and the second region interconnects the first and third regions.

* * * * *